US008063314B2

(12) United States Patent
Hsu et al.

(10) Patent No.: US 8,063,314 B2
(45) Date of Patent: Nov. 22, 2011

(54) PIN DEFINITION LAYOUT OF ELECTRONIC PAPER DISPLAY SCREEN

(75) Inventors: Yu-Chen Hsu, Taipei (TW); Chi-Meng Wu, Tainan (TW); Ya-Rou Chen, Taipei County (TW); Heng-Hao Chang, Taipei (TW); Chun-Ta Chien, Yilan County (TW); Chien-Pang Huang, Lujhou (TW); Cheng-Yi Su, Taichung County (TW)

(73) Assignee: E Ink Holdings Inc., Hsinchu (TW)

( * ) Notice: Subject to any disclaimer, the term of this patent is extended or adjusted under 35 U.S.C. 154(b) by 211 days.

(21) Appl. No.: 12/349,226

(22) Filed: Jan. 6, 2009

(65) Prior Publication Data

US 2010/0014222 A1 Jan. 21, 2010

(30) Foreign Application Priority Data

Jul. 16, 2008 (TW) ................................ 97126949 A

(51) Int. Cl.
*H05K 1/00* (2006.01)

(52) U.S. Cl. ........................................................ 174/261

(58) Field of Classification Search .................. 174/261
See application file for complete search history.

(56) References Cited

U.S. PATENT DOCUMENTS

| | | | | |
|---|---|---|---|---|
| 5,440,990 | A * | 8/1995 | Wiedefeld et al. | 102/215 |
| 5,828,355 | A * | 10/1998 | Comeau et al. | 345/59 |
| 7,733,335 | B2 * | 6/2010 | Zehner et al. | 345/204 |
| 7,821,286 | B2 * | 10/2010 | Lee et al. | 324/760.02 |
| 2006/0212679 | A1 * | 9/2006 | Alfano et al. | 712/38 |
| 2007/0008689 | A1 * | 1/2007 | Park | 361/683 |
| 2008/0150856 | A1 * | 6/2008 | Nam | 345/87 |

* cited by examiner

*Primary Examiner* — Jeremy Norris
*Assistant Examiner* — Tremesha S Willis
(74) *Attorney, Agent, or Firm* — CKC & Partners Co., Ltd.

(57) ABSTRACT

A pin definition layout of electronic paper display screen is provided. The electronic paper has a first pin area, a data signal source driver area, and a second pin area sequentially disposed at any side thereof. The first pin area and the second pin area each have a first power supply pin set and a second power supply pin set disposed thereon, and a plurality of No connections is disposed by intervals in the first power supply pin set and the second power supply pin set, so as to separate potential pins. Therefore, no interference is generated between the pins, thus achieving good electrical properties and reducing the wire complexity.

13 Claims, 7 Drawing Sheets

PIN DEFINITION LAYOUT OF ELECTRONIC PAPER DISPLAY SCREEN

BACKGROUND OF THE INVENTION

1. Field of the Invention

The present invention relates to an electronic paper, and in particularly, to a pin definition layout of electronic paper display screen having good electrical output properties and high yield after definition arrangement of pins, which is advantageous in being light, thin, short, and small.

2. Related Art

Generally speaking, liquid crystal display (LCD) is most used in 3C products. Many information must be stored into a computer or PDA, and then displayed on LCD when reading, so LCD can not replace newspapers and magazines. Therefore, a new generation display technique is an electronic paper display screen.

The development of the electronic paper display screen technology substantially includes electronic display and paper media. The electronic display is mainly made to be further light and thin, and be an animation display having the main features such as high chromaticity, high definition, and high brightness. The paper media mainly adopts an electronic ink technology, such as cholesteric liquid crystal, microcapsule electrophoresis, or Gyricon. The manufactured paper media is light and thin, and thus can replace the current paper. At the same time, the paper media has the functions of display the content of books and magazines for reading, thus being capable of replacing the conventional paper. Further, the paper media can be reused to achieve the environmental friendly feature.

As having no color filter and polaroids, the electronic paper display screen has the advantages such as a light weight, a high resolution, being read under sunlight, and bistable low-power consumption, thus being capable of replacing the current LCD gradually.

Referring to FIG. 1, a block diagram of a conventional electronic paper is shown. An electronic paper display screen 1 has an electronic paper 10. The electronic paper 10 has a source signal pin set 101 and a gate signal pin set 102 disposed at two adjacent sides thereof. The source signal pin set 101 and the gate signal pin set 102 are connected to a display unit 103 in the electronic paper 10 respectively.

Pins of the source signal pin set 101 are connected to a source driver 11, and pins of the gate signal pin set 102 are connected to a gate driver 12, such that the display unit 103 generates corresponding patterns or letters according to the signals input by the source driver 11 and the gate driver 12.

However, when being connected to an external circuit, the electronic paper display 1 still has the following disadvantages to be overcome.

1. In order to facilitate the circuit connection, the electronic paper 10 has the source signal pin set 101 and the gate signal pin set 102 disposed at two adjacent side, for being connected to the source driver 11 and the gate driver 12 respectively, and thus the volume of the circuit can not be effectively reduced.

2. The source signal pin set 101 and the gate signal pin set 102 each have pins for power supply input respectively, and at least include a positive potential, a negative potential, and a ground, which are disposed in parallel, so interelectrode capacitance or interference is easily generated between the pins.

Thus, the electronic paper display screen must control the change of the picture through a driving circuit, which is the same as the LCD, and the wire connection of the electronic paper display screen and the driving circuit is much important. Therefore, how to design the output/input pins of the electronic paper display screen to eliminate the interference between the pins, reduce the wire complexity, improve the circuit stability, achieve good electrical properties, and facilitate the manufactured products being lighter, thinner, shorter, and smaller, is an issue to be solved by the present invention.

SUMMARY OF THE INVENTION

In view of the above demands, the inventors designed a novel pin definition layout of electronic paper display screen after careful research and with accumulated years of experience in this field.

The present invention is directed to a pin definition layout of electronic paper display screen, which is capable of reducing the interference between pins, reducing the wire complexity, improving the circuit stability, achieving preferred electrical properties, and being more advantageous to the demand of "light, thin, short, and small".

As embodied and broadly described herein, the pin definition layout of electronic paper display screen as described in the present invention has an electronic paper. The electronic paper has a plurality of pins for electrical connection. The pins are at least divided into a first pin area, a data signal source driver area, and a second pin area. Thus, during the manufacturing process of the electronic paper, pin layout is merely required to be performed at one side, which reduces the wire complexity, the area, and the number of the pins.

The data signal source driver area is provided with a plurality of data signal source drivers for inputting external signals. The first and the second pin areas respectively have a first and a second power supply pin set, a first and a second logic pin set disposed therein. A NO connection is disposed between each two pins in the first and the power supply pin sets, and thus when the external power supply is input to the electronic paper through the first and the second power supply pin set, the pins are separated by the NO connections to avoid interference there-between.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

In order to make the examiners to understand the disclosure of the present invention clearly, the present invention is illustrated with reference to the drawings.

Figure 1:
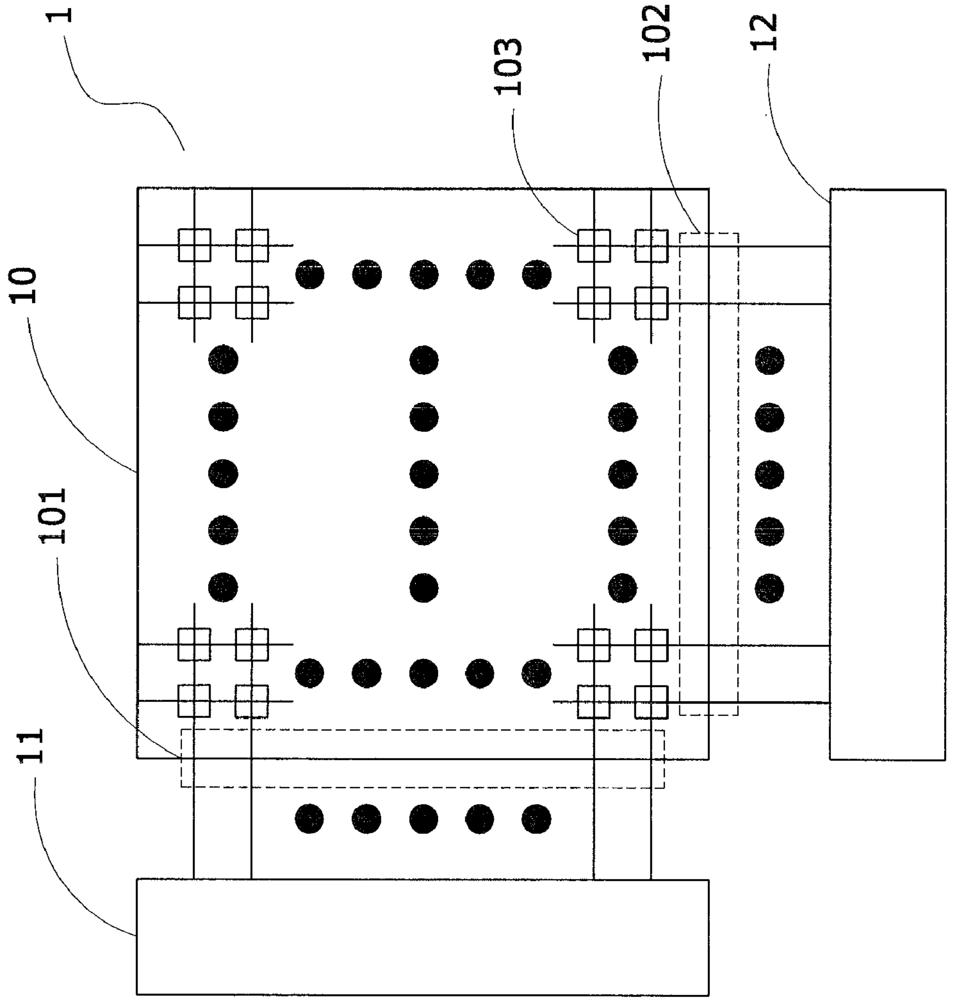
Fig.1 (prior art)
FIG. 1 is a schematic view of a circuit configuration of a conventional electronic paper.
Figure 2:
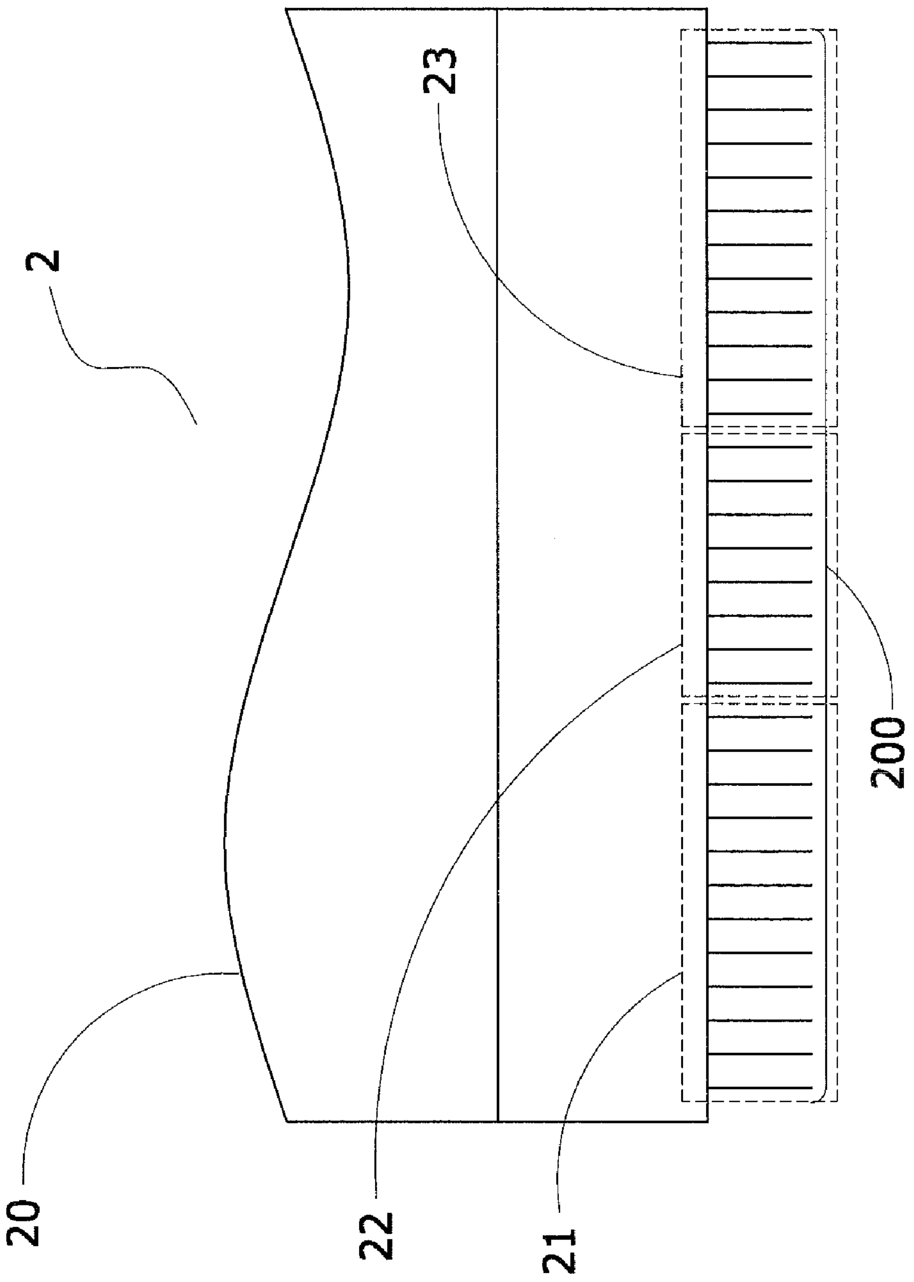
FIG. 2 is a block diagram of a preferred embodiment of the present invention.
Figure 3:
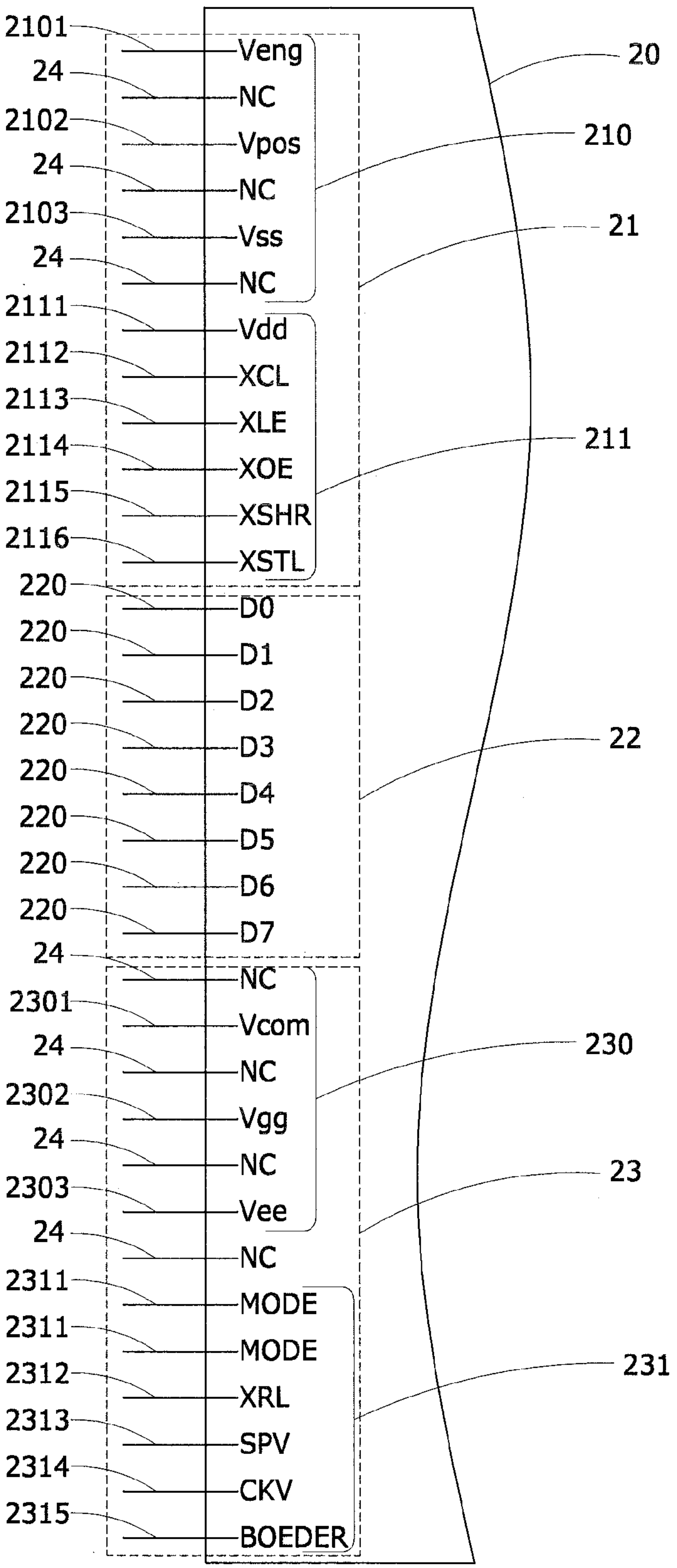
FIG. 3 is a schematic view of pins according to the preferred embodiment of the present invention.

FIGS. 2 and 3 are a block diagram and a schematic view of pins of a preferred embodiment of the present invention. Referring to FIGS. 2 and 3, the pin definition layout of electronic paper display screen 2 according to the present invention mainly has an electronic paper 20 having a plurality of pins 200 disposed at one side thereof. The pins 200 are divided into a first pin area 21, a data signal source driver area 22, and a second pin area 23 in sequence.

The first pin area 21 has a first power supply pin set 210 and a first logic pin set 211.

The first power supply pin set 210 has a negative power supply 2101 for inputting external negative potential, a positive power supply 2102 for inputting external positive potential, and a ground 2103 for grounding. The negative power supply 2101, the positive power supply 2102, and the ground 2103 are separated by a NO connection 24 there-between.

The first logic pin set 211 has a logic signal pin 2111, a clock control driver 2112, a latch control driver 2113, an output control driver 2114, a shift control driver 2115, and an initial pulse input driver 2116. The shift control driver 2115 receives a left shift control or a right shift control transmitted from the external.

As the ground 2103 of the first power supply pin set 210 is adjacent to the logic signal pin 2111 of the first logic pin set 211, the interference between the first power supply pin set 210 and the first logic pin set 211 can be avoided merely by disposing a NO connection 24 between the ground 2103 and the logic signal pin 2111.

The data signal source driver area 22 follows the first pin area 21 and includes a plurality of data signal source drivers 220. The number of the data signal source driver 220 is mainly set to be even, and preferably at least eight.

The second pin area 23 follows the data signal source driver area 22 and includes a second power supply pin set 230 and a second logic pin set 231.

The second power supply pin set 230 at least has a common power supply input driver 2301 for common connection, a positive power supply 2302 for inputting external positive potential, and a negative power supply 2303 for inputting external negative potential. The common power supply input driver 2301, the positive power supply 2302, and the negative power supply 2303 are respectively separated by a NO connection 24.

The second logic pin set 231 has a plurality of output mode set drivers 2311, a plurality of shift control drivers 2312, a plurality of initial pulse input drivers 2313, a plurality of clock input drivers 2314, and a plurality of frame signal drivers 2315. The shift control drivers 2312 receive a left shift control or a right shift control transmitted from the external.

As the negative power supply 2303 is adjacent to the second logic pin set 231, a NO connection 24 is disposed between the negative power supply 2303 and the output mode set driver 2311, so as to avoid the interference between the second power supply pin set 230 and the second logic pin set 231.

Figure 4:
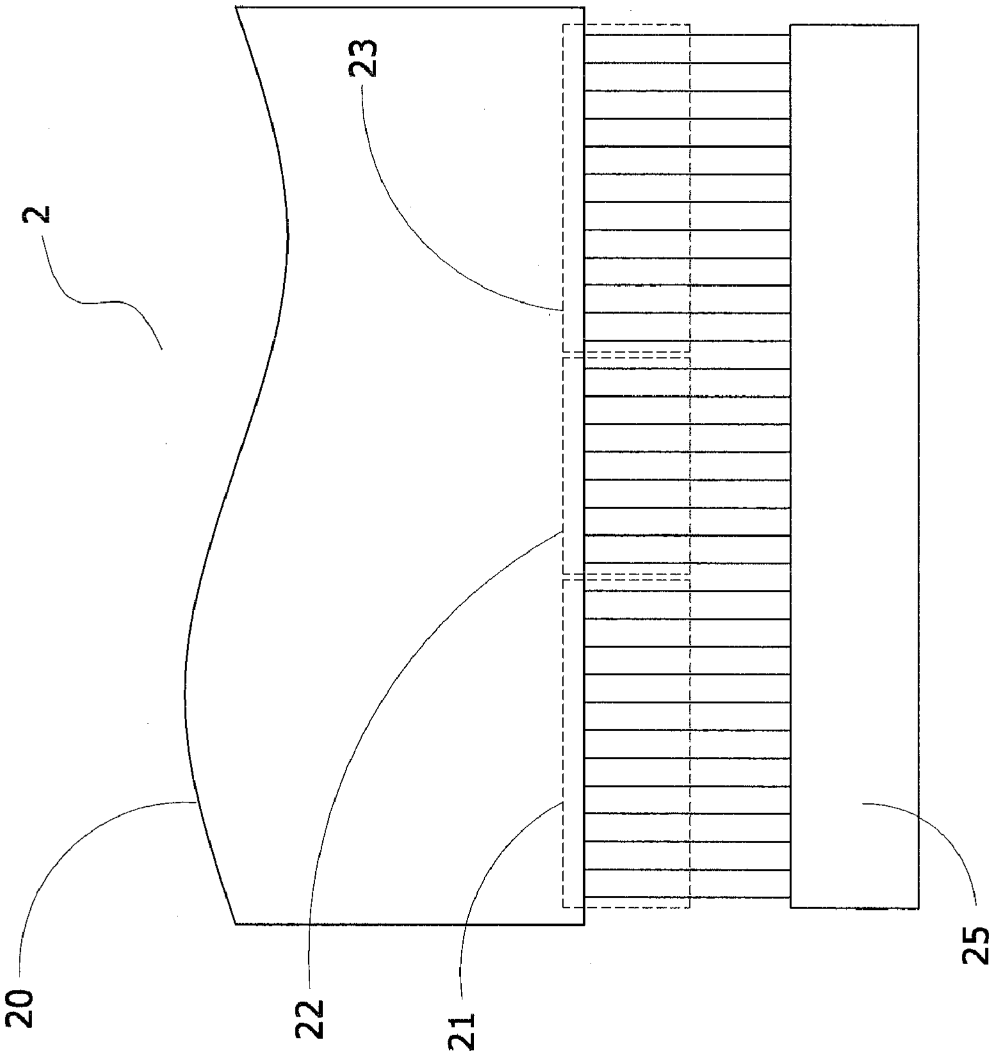
FIG. 4 is a first schematic view of the connection according to the preferred embodiment of the present invention.
Figure 5:
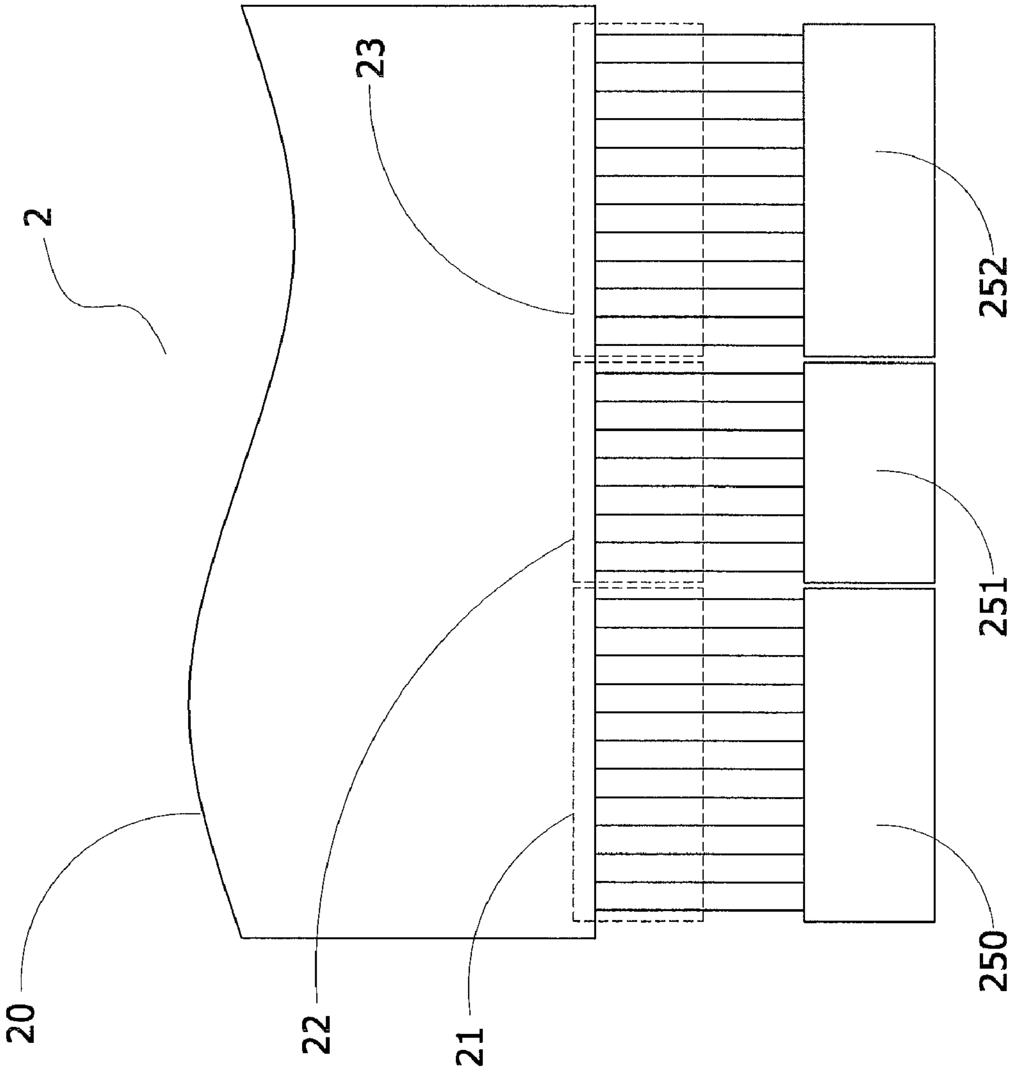
FIG. 5 is a second schematic view of the connection according to the preferred embodiment of the present invention.

FIGS. 4 and 5 are respectively a first and a second schematic view of the connection according to the preferred embodiment of the present invention. Referring to FIGS. 4 and 5, when connecting to the driving circuit 25, the electronic paper 20 is merely required to connect through a single side, and the other sides can have no circuit connected. Thus, during the manufacturing process of the electronic paper display screen 2, the volume of the circuit board and the external devices may be reduced significantly. At the same time, the first pin area 21, the data signal source driver area 22, and the second pin area 23 have a small pitch there-between and are on the same side, thus a source driving circuit 250, a signal input circuit 251, a gate driving circuit 252 are miniaturized accordingly.

Figure 6:
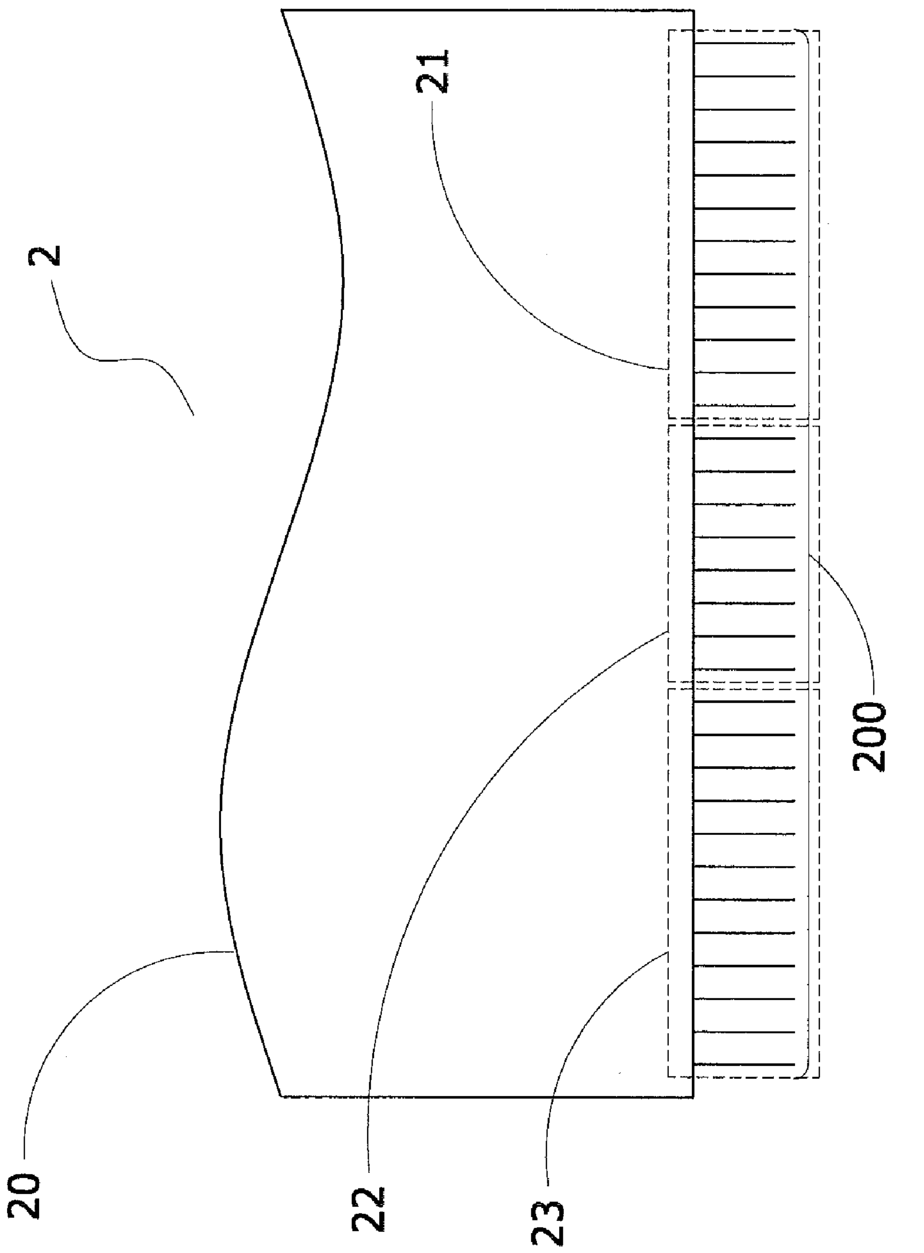
FIG. 6 is a block diagram of another preferred embodiment of the present invention
Figure 7:
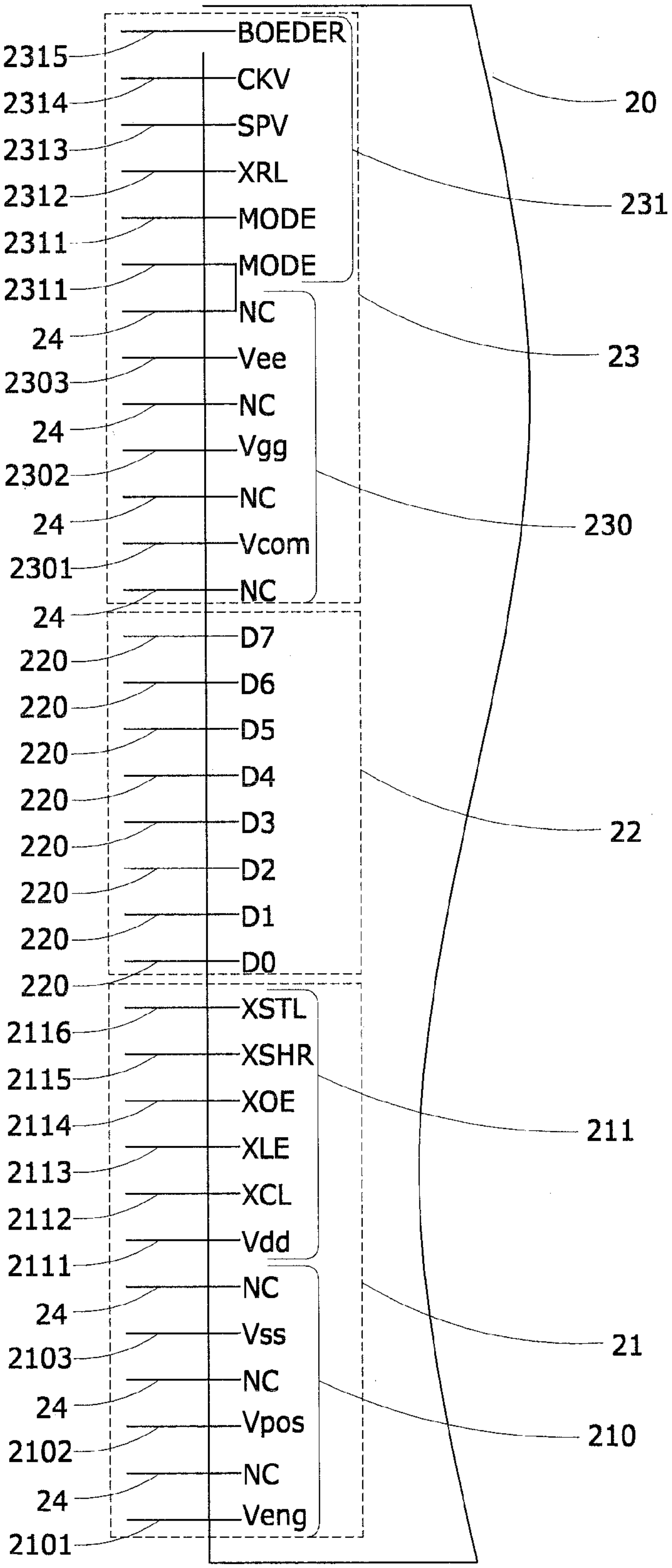
FIG. 7 is a schematic view of pins according to another preferred embodiment of the present invention.

FIGS. 6 and 7 are respectively a block diagram and a schematic view of pins of another preferred embodiment of the present invention. Referring to FIGS. 6 and 7, an electronic paper 20 of an electronic paper display screen pin definition layout of the present invention has a plurality of pins 200 disposed at one side. The pins 200 are divided into a second pin area 23, a data signal source driver area 22, and a first pin area 21 in sequence. The position of the first pin area 21 and the second pin area 23 can be exchanged according to the requirements of use, and the first pin area 21 and the second pin area 23 can define positions and configurations of the pins 200 in the same manner as that in FIG. 3.

Further, the negative power supply 2101, the positive power supply 2102, and the ground 2103 of the first power supply pin set 210 can be disposed in sequence or in a staggered manner.

For example, the sequence is any combination such as the negative power supply 2101, the positive power supply 2102, and the ground 2103, or the ground 2103, the positive power supply 2102, the negative power supply 2101, or the negative power supply 2101, the ground 2103, and the positive power supply 2102, which may be adjusted as desired when using.

The pins in the first logic pin set 211, the second power supply pin set 230, and the second logic pin set 231 can also be disposed in the same manner as that of the first power supply pin set 210. The positions of the pins are changed, and the pins after the change are still maintained in the original area.

Referring to all the drawings together, the present invention has the following efficacies and advantages.

Interference between the power supply pins is avoided.

The plurality of NO connections 24 is disposed in the first power supply pin set 210 and the second power supply pin set 230, that is to say, at least three NO connections 24 are disposed between the negative power supply 2101, the positive power supply 2102, and the ground 2103 of the first power supply pin set 210, and at least three NO connections 24 are disposed between the common power supply input driver 2301, the positive power supply 2302, the negative power supply 2303 of the second power supply pin set 230. Thus, when the power supply is input into the electronic paper 20 through the first power supply pin set 210 and the second power supply pin set 230, no interference is generated between the potentials, thus avoiding the generation of undesired signals and interelectrode capacitance.

Interference between the signal pins is avoided.

A NO connection 24 is disposed between the first power supply pin set 210 and the first logic pin set 211, between the data input area 22 and the second power supply pin set 230, and between the second power supply pin set 230 and the second logic pin set 231. Thus, after an external power supply or signal data is input into the electronic paper 20, no signal interference is generated at the edges of the first pin area 21, the data signal source driver area 22, and the second pin area 23, thus achieving good electrical properties.

The wire complexity is reduced.

The electronic paper 20 has a pin layout at a single side, so when being connected to an external circuit, the circuits are disposed at the same side, thus reducing the problem of wire wrapping and crossing, and further reducing the area and the number of the pins.

The above description is merely preferred embodiments of the present invention, and is not intended to limit the present invention. It will be apparent to those skilled in the art that various alternations and modifications can be made without departing from the scope or spirit of the invention based on the teaching and disclosure of the present invention.

To sum up, the pin definition layout of electronic paper display screen of the present invention has creativeness of patent and industrial applicability. The present application is thus filed for an innovation patent according to the Patent Law.

What is claimed is:

1. An electronic paper having opposite first and second sides, for an electronic paper display screen, comprising a plurality of pins capable of being coupled to a predetermined driving circuit, the plurality of pins including:

a first pin area, comprising a first power supply pin set and a first logic pin set, a NO connection being disposed between each two neighboring pins of the first power supply pin set;

a data signal source driver area comprising a plurality of data signal source drivers; and a second pin area comprising a second power supply pin set and a second logic pin set, a NO connection being disposed between each two neighboring pins of the second power supply pin set, wherein the first pin area, the data signal source driver area, and the second pin area all are disposed on the first side of the electronic paper for being connected to the driving circuit, and the data signal source driver area is disposed between the first and second pin areas.

2. The electronic paper according to claim 1, wherein the first power supply pin set at least comprises a negative power supply, a positive power supply, and a ground.

3. The electronic paper according to claim 1, wherein the first logic pin set at least comprises a logic signal pin, a clock control driver, a latch control driver, an output control driver, a shift control driver, and an initial pulse input driver.

4. The electronic paper according to claim 3, wherein the shift control driver is a left shift control.

5. The electronic paper according to claim 3, wherein the shift control driver is a right shift control.

6. The electronic paper according to claim 1, wherein a number of the data signal source driver is set to be even.

7. The electronic paper according to claim 1, wherein the second power supply pin set at least comprises a common power supply input driver, a positive power supply, and a negative power supply.

8. The electronic paper according to claim 1, wherein the second logic pin set at least comprises a frame signal driver, an output mode set driver, a shift control driver, an initial pulse input driver, and a clock input driver.

9. The electronic paper according to claim 8, wherein the shift control driver is a left shift control.

10. The electronic paper according to claim 8, wherein the shift control driver is a right shift control.

11. The electronic paper according to claim 8, wherein the first pin area is a source pin area, and the second pin area is a gate pin area.

12. The electronic paper according to claim 8, wherein the first pin area is a gate pin area, and the second pin area is a source pin area.

13. The electronic paper according to claim 1, further comprising three No connections respectively disposed between the first power supply pin set and the first logic pin set, between the data signal source driver area and the second power supply pin set, and between the second power supply pin set and the second logic pin set.

* * * * *